United States Patent [19]

Havel

[11] Patent Number: 5,003,247

[45] Date of Patent: Mar. 26, 1991

[54] MEASURING DEVICE WITH VARIABLE COLOR BACKGROUND

[76] Inventor: Karel Havel, 15 Kensington Road, Apt. #704, Bramalea, ON, Canada, L6T 3W2

[21] Appl. No.: 518,779

[22] Filed: May 4, 1990

Related U.S. Application Data

[60] Division of Ser. No. 337,410, Apr. 13, 1989, abandoned, which is a division of Ser. No. 940,100, Dec. 10, 1986, Pat. No. 4,831,326, Continuation-in-part of Ser. No. 882,430, Jul. 7, 1986, Pat. No. 4,734,619.

[51] Int. Cl.[5] .................... G01R 15/08; G09G 3/30

[52] U.S. Cl. .................... 324/115; 324/96; 340/703

[58] Field of Search .............. 324/115, 96, 99 D, 120; 340/701, 702, 703, 762

[56] References Cited

U.S. PATENT DOCUMENTS

| | | | |
|---|---|---|---|
| 2,643,344 | 6/1953 | McLaren et al. | 324/115 |
| 2,682,000 | 6/1954 | Clayton et al. | 324/115 |
| 2,889,518 | 6/1959 | Hudson et al. | 324/99 D |
| 3,740,570 | 6/1973 | Kaelin et al. | 340/703 |
| 3,840,873 | 10/1974 | Usui | 340/378 R |
| 3,924,227 | 12/1975 | Stolov | 340/762 |
| 4,360,804 | 11/1982 | Ohura | 340/703 |
| 4,438,498 | 3/1984 | Sekel et al. | 364/483 |
| 4,484,187 | 11/1984 | Brown et al. | 340/703 |
| 4,758,828 | 7/1988 | Mitsumori | 340/703 |

FOREIGN PATENT DOCUMENTS 1257334 7/1989 Canada .

*Primary Examiner*—Ernest F. Karlsen

[57] ABSTRACT

A measuring device includes a display which is comprised of a plurality of adjacent display elements, each including a display area for exhibiting an indication of the measured value, substantially surrounded by a variable color background area. The color control inputs of the background areas, which are respectively coupled, may be selectively activated for illuminating the background areas in a uniform color which effectively indicates that it relates to the indication of the measured value exhibited on the display areas.

7 Claims, 6 Drawing Sheets

MEASURING DEVICE WITH VARIABLE COLOR BACKGROUND

CROSS-REFERENCE TO RELATED APPLICATIONS

This is a division of my copending application Ser. No. 07/337,410, filed on Apr. 13, 1989, now abandoned, entitled Digital Voltmeter with Variable Color Background, which is a division of my application Ser. No. 06/940,100, filed on Dec. 10, 1986, entitled Digital Voltmeter with Variable Color Background, now U.S. Pat. No. 4,831,326 issued on May 16, 1989, which is a continuation-in-part of my application Ser. No. 06/882,430, filed on Jul. 7, 1986, entitled Display Device with Variable Color Background, now U.S. Pat. No. 4,734,619 issued on Mar. 29, 1988.

This also relates to my application Ser. No. 06/819,111, filed on Jan. 15, 1986, entitled Variable Color Digital Multimeter, now U.S. Pat. No. 4,794,383 issued on Dec. 27, 1988, to my application Ser. No. 06/946,036, filed on Dec. 24, 1986, entitled Variable Color Analog Voltmeter, now U.S. Pat. No. 4,812,744 issued on Mar. 14, 1989, and to my application Ser. No. 07/155,311, filed on Feb. 12, 1988, entitled Display Telephone with Transducer, now U.S. Pat. No. 4,845,745 issued on Jul. 4, 1989.

BACKGROUND OF THE INVENTION

1. Field of the Invention

This invention relates to measuring devices utilizing a variable color display.

2. Description of the Prior Art

Commercially available measuring instruments with monochromatic digital readout are capable of performing measurements and displaying results at a relatively fast rate. However, to determine a significance of each measured value, an operator must rapidly read displayed values and perform mental comparisons with predetermined limits. The task is much more complicated when the limits are variable.

A system for measuring radioactivity described in U.S. Pat. No. 2,643,344, issued on Jun. 23, 1953 to Ian H. McLaren et al., includes an indicator with three scales and three associated light bulbs of respectively different colors. Each of the light bulbs illuminates the indicator face with a distinctive color to indicate which measurement scale is applicable.

A digital meter described in U.S. Pat. No. 2,889,518, issued on Jun. 2, 1959 to Harold R. Hudson et al., includes a rotation counter mechanically driven by a motor which also rotates a potentiometer. The motor continues to rotate until the voltage at the wiper of the potentiometer is equal to the unknown voltage. The numerical count on the counter is then a direct measure of the unknown voltage. To indicate measurement range, lamps are placed between the different rotatable sections of the mechanical counter to indicate by lighting the decimal point for the counter reading.

A driving circuit for light emitting diodes, described in U.S. Pat. No. 3,740,570 issued on Jun. 19, 1973 to George R. Kaelin et al., utilizes special light emitting diodes that emit light of different colors in response to different currents.

SUMMARY OF THE INVENTION

Accordingly, it is the principal object of this invention to provide an improved measuring device for facilitating prompt recognition of a significance of the measured value.

It is another object of the invention to provide an improved measuring device utilizing a variable color display.

It is still another object of the invention to provide a measuring device employing a variable color display with integral variable color background area.

It is still another object of the invention to provide a measuring device employing variable color display elements which have coupled color control inputs.

In summary, a measuring device of the invention includes a variable color display device for exhibiting an indication of a measured value. The display device includes a plurality of display areas, each surrounded by a variable color background area. The color control inputs of the background areas are respectively coupled. Means are provided for selectively activating the coupled color control inputs of the background areas to illuminate them in a selective uniform color. The color of the background areas effectively indicates that it relates to the indication of the measured value exhibited on the display areas.

Further objects of the invention will become obvious from the accompanying drawings and their description.

BRIEF DESCRIPTION OF THE DRAWINGS

In the drawings in which are shown the preferred embodiments of the invention.

Throughout the drawings, like characters indicate like parts.

DESCRIPTION OF THE PREFERRED EMBODIMENTS

Figure 1:
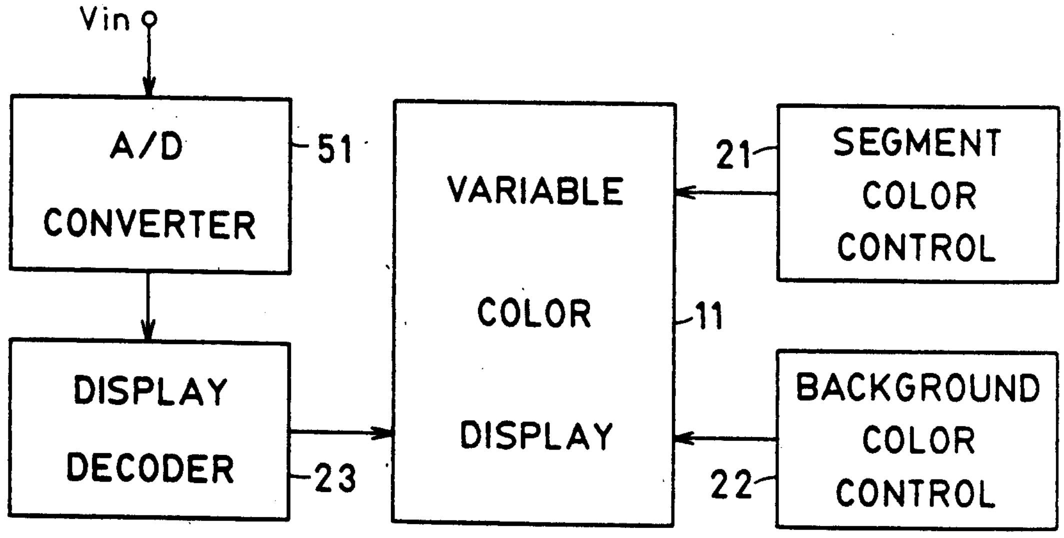
FIG. 1 is a block diagram of a digital voltmeter utilizing a display with variable color background.

Referring now, more particularly, to the drawings, in FIG. 1 is shown a block diagram of a digital voltmeter utilizing a variable color display surrounded by a variable color background area. The digital voltmeter includes an A/D (analog to digital) converter 51, for converting an analog signal Vin applied to its input to digital data, and a display decoder 23 for causing the digital data to be displayed in a character format on a variable color display 11, in a manner well known to those skilled in the art. As will be more specifically pointed out subsequently, the display 11 includes variable color display areas arranged in a pattern and surrounded by an integral variable color background area. The invention resides in the addition of a segment color control 21 and a background color control 22 for illuminating display 11 in a color related to the measured value. The digital voltmeter of this invention can thus simultaneously indicate the measured value, in a character format, and its significance, in a color of the display. By way of an example, measured value that is considered to be normal may be indicated in green color, measured value that is slightly abnormal may be indicated in blue color, and measured value that is critical may be indicated in red color.

Figure 2:
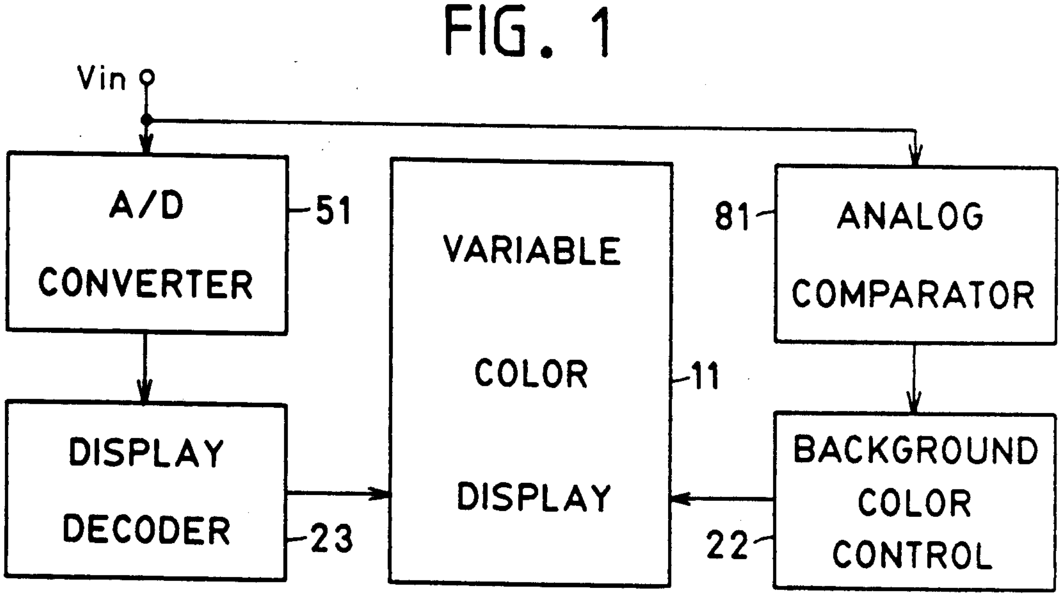
FIG. 2 is a block diagram of a variable color background digital voltmeter with an analog comparator.

In FIG. 2 is shown a block diagram of a like digital voltmeter characterized by an analog comparator 81. The input of analog comparator 81 is coupled to the input of A/D converter 51 for comparing an input signal with predetermined limits and for developing comparison signals accordingly. The background color control 22 illuminates the background area of display 11 in accordance with the comparison signals.

Figure 3:
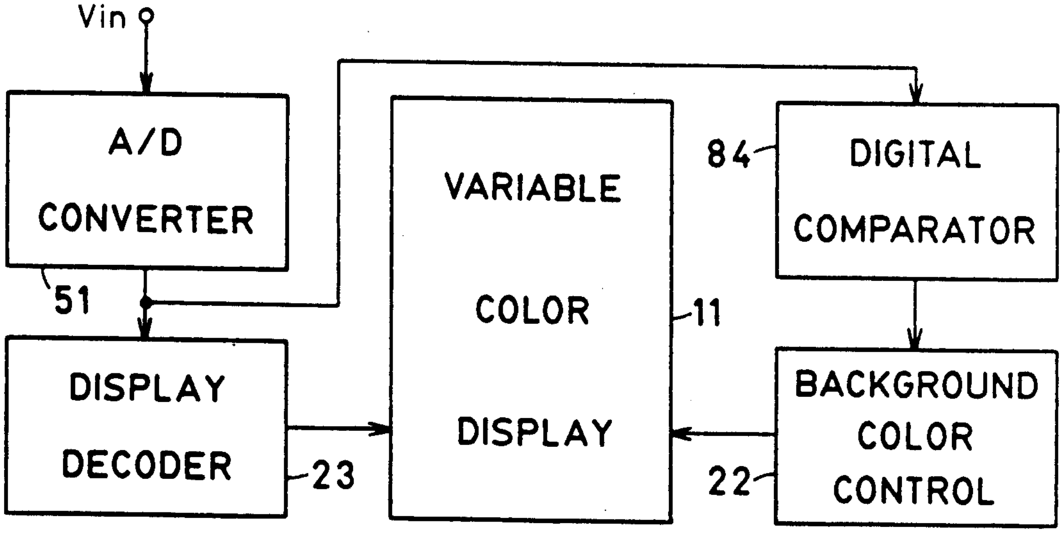
FIG. 3 is a block diagram of a variable color background digital voltmeter with a digital comparator.

In FIG. 3 is shown a block diagram of a like digital voltmeter characterized by a digital comparator 84. The input of digital comparator 84 is coupled to the output of A/D converter 51 for comparing the output digital data with predetermined limits and for developing comparison signals accordingly. The background color control 22 illuminates the background area of display 11 in accordance with the comparison signals.

Figure 4:
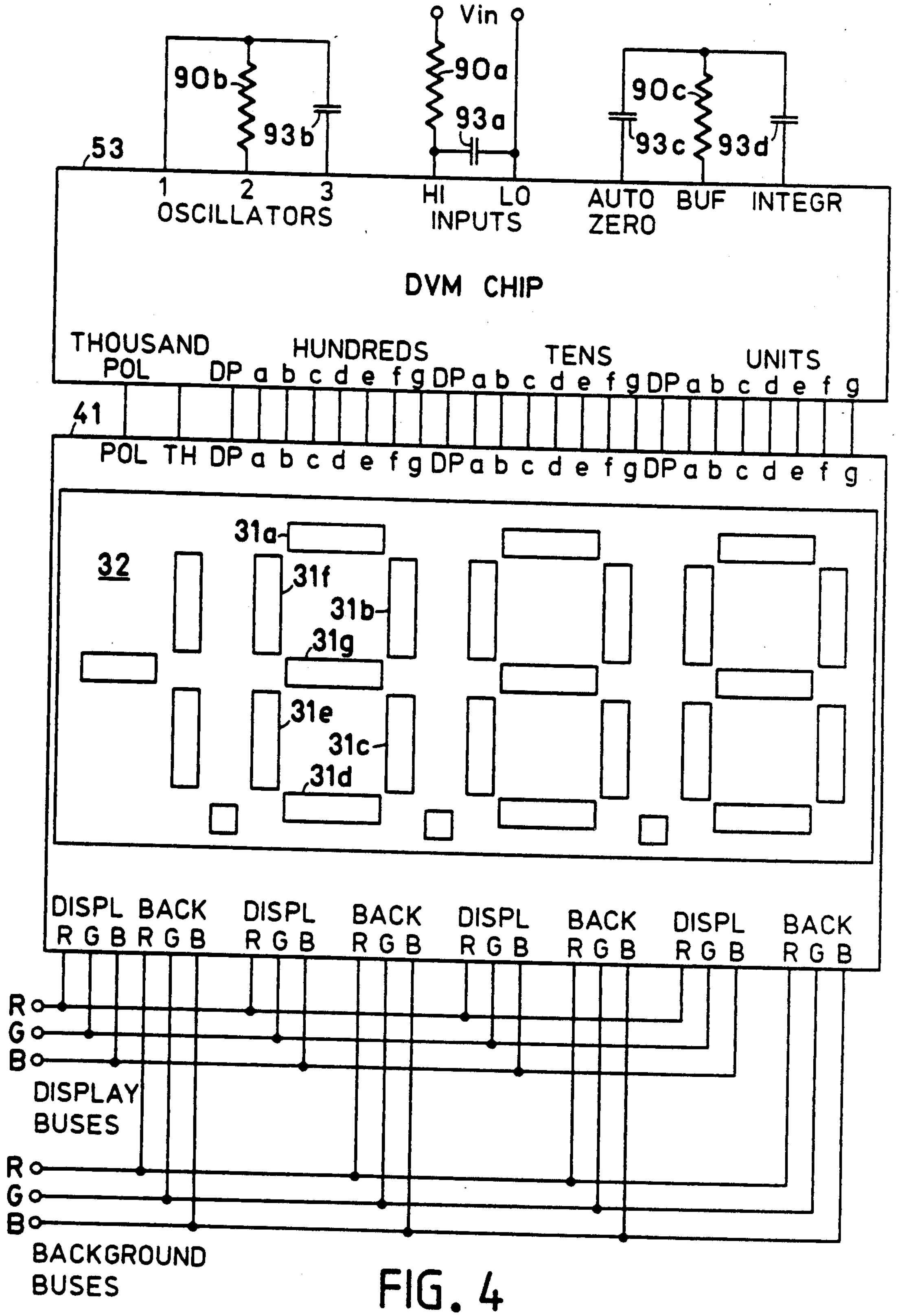
FIG. 4 is a simplified schematic diagram of a digital voltmeter of the invention.

In FIG. 4 is shown a schematic diagram of a digital voltmeter of this invention which includes a DVM (digital voltmeter) chip 53 for measuring input signal Vin applied, via a resistor 90*a* and decoupling capacitor 93*a*, to its HI (high) and LO (low) inputs, and for developing segment drive signals a, b, c, d, e, f, g, and DP (decimal point) for a 3½ digit variable color display 41 on which measured values of the input signal may be indicated in a character format. Resistor 90*b* and capacitor 93*b*, coupled to input OSCILLATORS, are provided for selecting a suitable frequency of internal oscillators. An auto zero capacitor 93*c* tends to decrease noise. Integrating capacitor 93*d* and buffer resistor 90*c* provide desired voltage swing and linearity.

The first display element of the display 41 consists of a figure '1' and a minus sign. The second, third, and fourth display elements consist of seven segments arranged in a well known 7-segment font on which selected characters may be exhibited in variable color. In the second display element, the segments are designated as 31*a*, 31*b*, 31*c*, 31*d*, 31*e*, 31*f*, and 31*g*. Each display element has three color control inputs R (red), G (green), and B (blue) designated DISPL. Each display element is surrounded by a variable color background area, as will be more clearly pointed out subsequently. The background area of each display element also has three color control inputs R, G, and B designated as BACK. It is obvious from the illustration that the color control inputs of the display elements and background areas are respectively interconnected to form DISPLAY BUSES R, G, and B, for uniformly controlling color of all display elements, and BACKGROUND BUSES R, G, and B, for uniformly controlling color of the entire background area 32.

Figure 5:
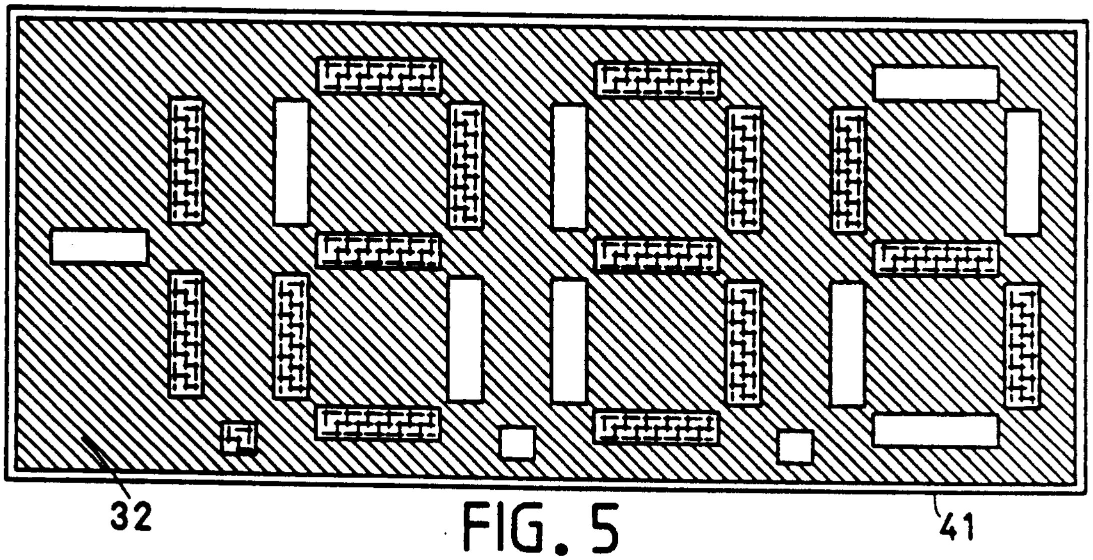
FIG. 5 is an exemplary detail of the display on which measured result is displayed in yellow color on green background.
Figure 6:
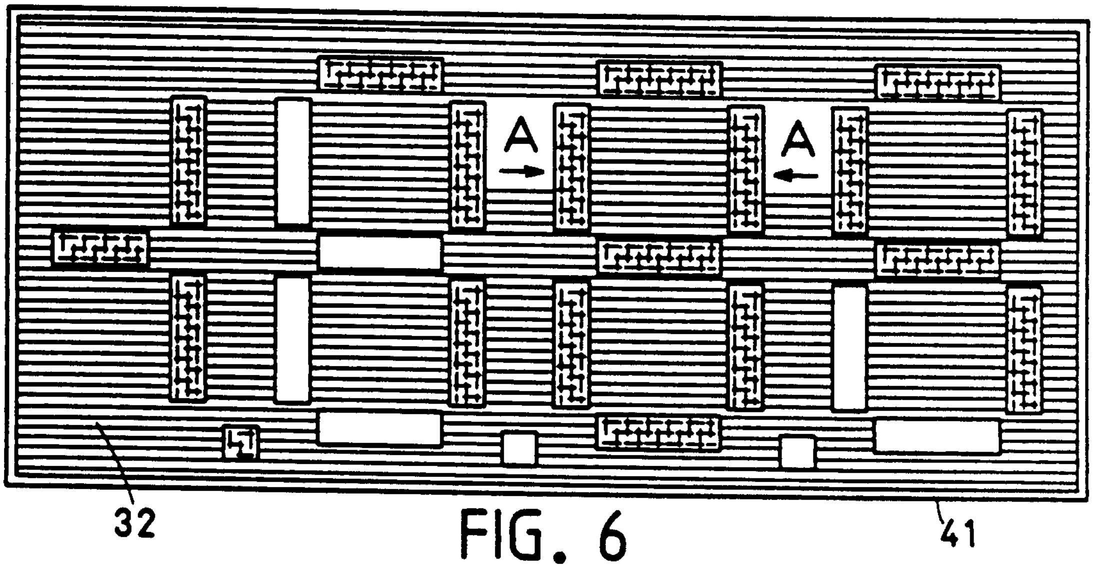
FIG. 6 is a similar detail of the display on which measured result is displayed in yellow color on blue background.
Figure 7:
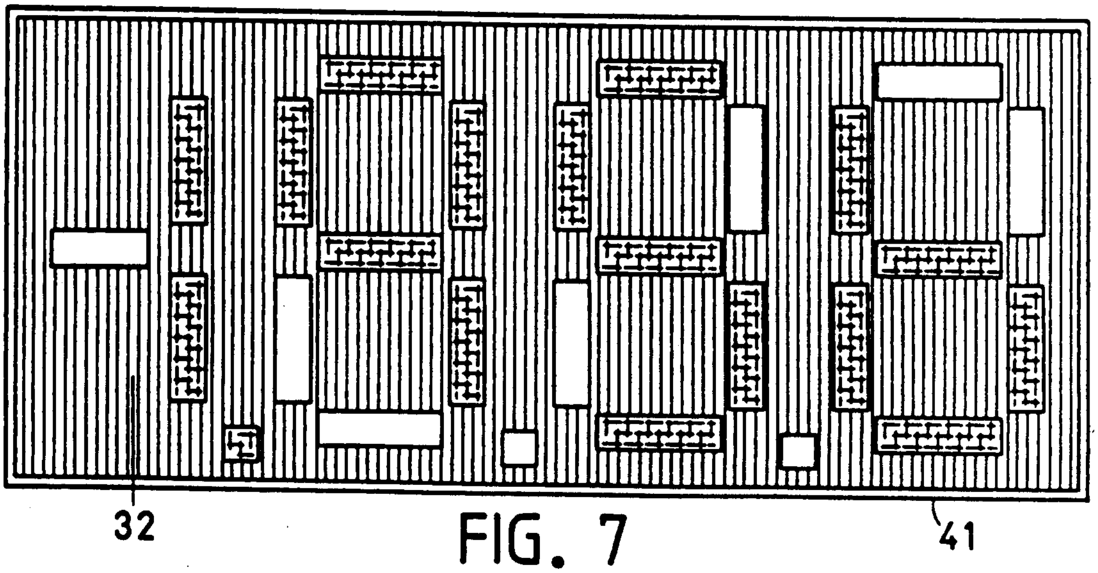
FIG. 7 is a similar detail of the display on which measured result is displayed in yellow color on red background.

FIGS. 5 to 7 are examples of displayed measured values which consider exemplary low limit −1.5 and high limit 1.5 (in Volts or in any other suitable units). The invention resides in controlling the color of background area 32 to indicate whether the measured value lies within the bounds of the low and high limits, below the low limit, or above the high limit. FIG. 5 shows display 41 on which a measured value 1.234 is displayed on green background, to indicate that it lies within the bounds of the low and high limits. FIG. 6 shows display 41 on which a measured value −1.789 is displayed on blue background, to indicate that it lies below the low limit. FIG. 7 shows display 41 on which a measured value 1.956 is displayed on red background, to indicate that it lies above the high limit. To render the illustration less complex, all measured values are displayed in yellow color. It will be appreciated that the color of the display areas may be also varied, to enhance the presentation, as will be pointed out subsequently.

It is readily apparent that the method of displaying measured values shown in FIGS. 5 to 7 is extremely advantageous. Being completely surrounded by background area 32, all display elements in display 41 are effectively associated therewith. It is perfectly clear that the color of background area 32 relates to the values exhibited on the display elements within its boundaries, and not to values exhibited on display elements which may be located outside the boundaries.

Figure 8:
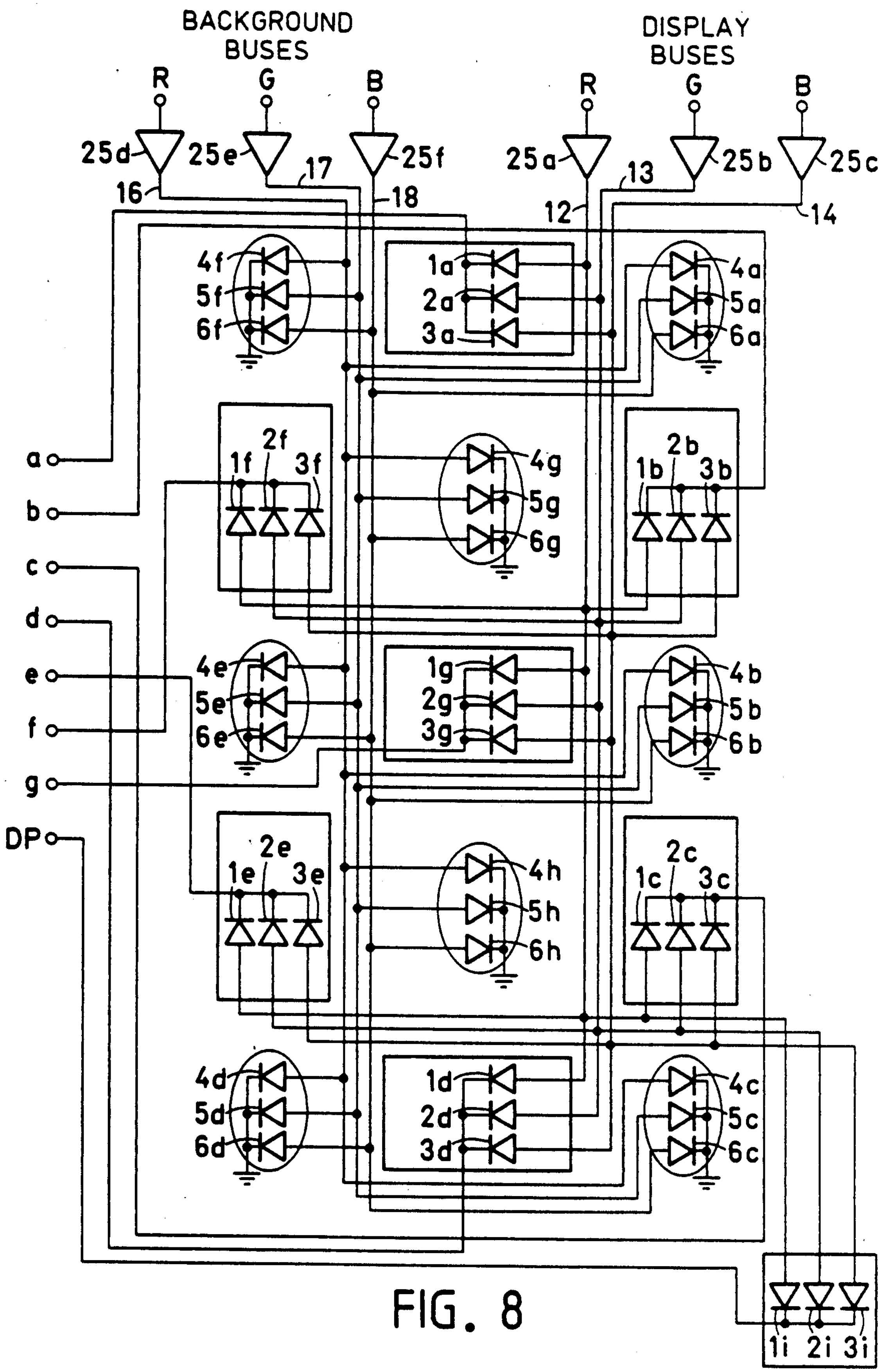
FIG. 8 is a simplified schematic diagram of one element of a variable color display device.

Proceeding now to the detailed description, in FIG. 8 is shown a simplified schematic diagram of a one-character 7-segment variable color display element with variable color background. Each display segment of the display element includes a triad of closely adjacent LEDs: a red LED 1, green LED 2, and blue LED 3 which are adapted for producing a composite light signal of a variable color. To facilitate the illustration, the LEDs are designated by segment letters, e.g., red LED in the segment b is shown at 1*b*, green LED in the segment d is shown at 2*d*, and blue LED in the segment f is shown at 3*f*. The background area is comprised of background regions adjacent the display segments. Each background region includes a triad of closely adjacent LEDs: a red LED 4, green LED 5, and blue LED 6 which are adapted for producing a composite light signal of a variable color. As much as possible, the LEDs in the background regions are designated by letters of adjacent display segments.

The cathodes of all red, green, and blue display LED triads are interconnected in each display segment and electrically connected to respective inputs a, b, c, d, e, f, g, and DP (decimal point) which may be coupled to the outputs of DVM chip 53 viewed in FIG. 4. The anodes of all display red LEDs 1*a*, 1*b*, 1*c*, 1*d*, 1*e*, 1*f*, 1*g*, and 1*i* are commonly coupled to an electric path referred to as a display red bus 12. The anodes of all display green LEDs 2*a*, 2*b*, 2*c*, 2*d*, 2*e*, 2*f*, 2*g*, and 2*i* are commonly coupled to a like electric path referred to as a display green bus 13. The anodes of all display blue LEDs 3*a*, 3*b*, 3*c*, 3*d*, 3*e*, 3*f*, 3*g*, and 3*i* are commonly coupled to a like electric path referred to as a display blue bus 14.

In a similar fashion, the anodes of all background red LEDs 4*a*, 4*b*, 4*c*, 4*d*, 4*e*, 4*f*, 4*g*, and 4*h* are commonly coupled to an electric path referred to as a background red bus 16. The anodes of all background green LEDs 5*a*, 5*b*, 5*c*, 5*d*, 5*e*, 5*f*, 5*g*, and 5*h* are commonly coupled to a like electric path referred to as a background green bus 17. The anodes of all background blue LEDs 6a, 6b, 6c, 6d, 6e, 6f, 6g, and 6h are commonly coupled to a like electric path referred to as a background blue bus 18. The cathodes of all red, green, and blue LED triads in each background region are grounded.

The display red bus 12 is connected to the output of a non-inverting buffer 25a capable of sourcing sufficient current to illuminate all display red LEDs. The display green bus 13 is connected to the output of a like buffer 25b. The display blue bus 14 is connected to the output of a like buffer 25c. The background red bus 16 is connected to the output of a like buffer 25d. The background green bus 17 is connected to the output of a like buffer 25e. The background blue bus 18 is connected to the output of a like buffer 25f. It would be obvious to those skilled in the art that current limiting resistors may be connected in series with all LEDs in the circuit to constrain current flow.

The operation of the display element shown in FIG. 4 will be now explained by the example of illuminating digit '1' in yellow color. To exhibit decimal number '1', low voltage levels are applied to the inputs b and c, to illuminate equally designated segments, and high voltage levels are applied to all remaining inputs a, d, e, f, g, and DP, to extinguish all remaining segments.

To illuminate the display element in yellow color, the color control inputs R and G of the display buses are raised to a high logic level, while color control input B is maintained at a low logic level. As a result, the outputs of buffers 25a and 25b rise to a high logic level. The current flows from the output of buffer 25a, via display red bus 12 and red LED 1b, to the input b, and, via red LED 1c, to the input c. The current also flows from the output of buffer 25b, via display green bus 13 and green LED 2b, to the input b, and, via green LED 2c, to the input c. As a result of blending light signals of red and green colors in the segments b and c, the segments illuminate in substantially yellow color, creating a visual impression of a character '1'.

To illuminate the background area in green color, the color control input G of the background buses is raised to a high logic level, while the remaining color control inputs R and B are low. As a result, the output of buffer 25e rises to a high logic level. The current flows therefrom, via background green bus 17 and green LEDs 5a, 5b, 5c, 5d, 5e, 5f, 5g, and 5h in all background regions, to ground. The entire background area illuminates in green color.

To illuminate the background area in blue color, the color control input B of the background buses is raised to a high logic level, while the remaining color control inputs R and G are low. As a result, the output of buffer 25f rises to a high logic level. The current flows therefrom, via background blue bus 18 and blue LEDs 6a, 6b, 6c, 6d, 6e, 6f, 6g, and 6h in all background regions, to ground. The entire background area illuminates in blue color.

To illuminate the background area in red color, the color control input R of the background buses is raised to a high logic level, while the remaining color control inputs G and B are low. As a result, the output of buffer 25d rises to a high logic level. The current flows therefrom, via background red bus 16 and red LEDs 4a, 4b, 4c, 4d, 4e, 4f, 4g, and 4h in all background regions, to ground. The entire background area illuminates in red color.

Figure 9:
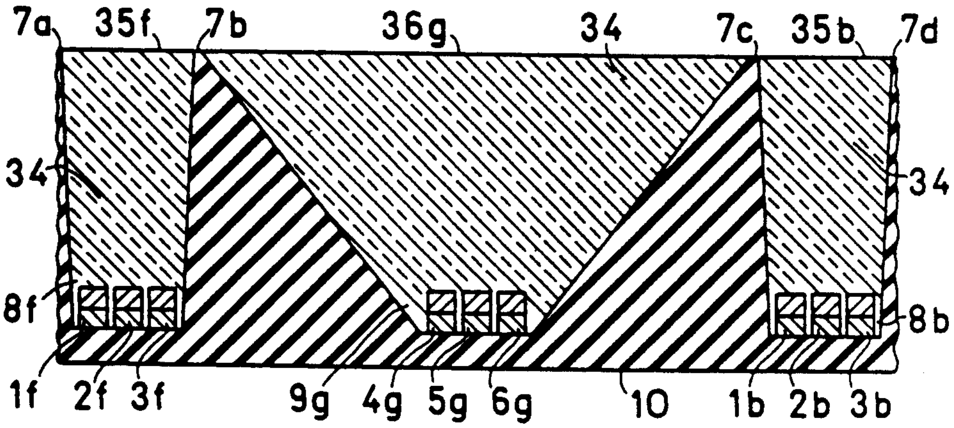
FIG. 9 is a cross-sectional view, taken along the line A—A in FIG. 6, revealing internal structure of a portion of a variable color display device.

An important consideration has been given to physical arrangement of the LEDs in the display areas and background regions, as illustrated in FIG. 9. Display red LED 1f, green LED 2f, and blue LED 3f are disposed on a support 10 in a display light blending cavity 8f and completely surrounded by a transparent light scattering material 34. When forwardly biased, LEDs 1f, 2f, and 3f emit light signals of red, green, and blue colors, respectively, which are blended by passing through light scattering material 34, acting to disperse the light signals, to form a composite light signal that emerges at the upper surface 35f. The color of the composite light signal may be controlled by varying the portions of red, green, and blue light signals. Display red LED 1b, green LED 2b, and blue LED 3b are similarly disposed in a display light blending cavity 8b and may be similarly activated.

In a similar fashion, background red LED 4g, green LED 5g, and blue LED 6g are disposed on support 10 in a background light blending cavity 9g and surrounded by transparent light scattering material 34. When forwardly biased, LEDs 4g, 5g, and 6g emit light signals of red, green, and blue colors, respectively, which are blended by passing through light scattering material 34 to form a composite light signal of a composite color that emerges at the upper surface 36g.

The display light blending cavities are optically separated from adjacent background light blending cavities by opaque walls. The display light blending cavity 8f is defined by walls 7a and 7b which have generally smooth inclined surfaces defining an obtuse angle with support 10. The walls 7b and 7c similarly define a background light blending cavity 9g therebetween. In a similar fashion, display light blending cavity 8b is defined by the 7c and 7d. The width of the top surfaces of the opaque walls is uniform and distinctly less than the width of the display areas or background regions so as to minimize the boundaries therebetween. The top surfaces of the opaque walls and top surfaces of the display areas and background regions are in the same plane to allow wide angle observation of the display device. Although the walls and light blending cavities are shown to be of certain shapes and dimensions, it is envisioned that they may be modified and rearranged.

Figure 10:
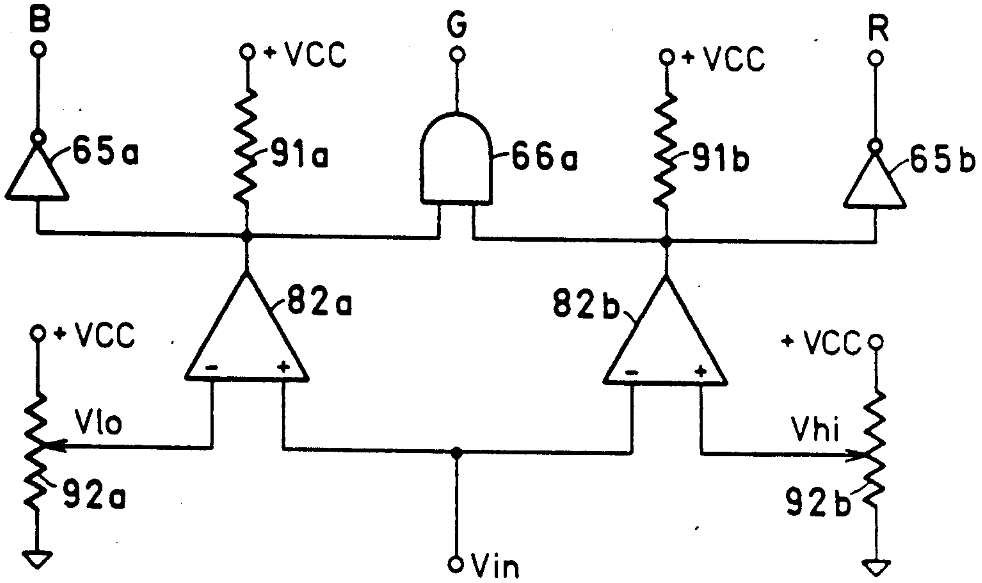
FIG. 10 is a schematic diagram of an analog comparator for developing color control signals.

In FIG. 10, the input signal Vin is applied to the interconnected inputs of two analog comparators 82a, 82b in a classic 'window' comparator configuration. When the input voltage is lower than the low voltage limit Vlo, set by a potentiometer 92a, the output of analog comparator 82a drops to a low logic level, thereby forcing the output of an inverter 65a to rise to a high logic level to develop active color control signal B.

When the input voltage is higher than the high voltage limit Vhi, set by a potentiometer 92b, the output of analog comparator 82b drops to a low logic level, thereby forcing the output of an inverter 65b to rise to a high logic level to develop active color control signal R.

When the input voltage is between the low voltage limit Vlo and the high voltage limit Vhi, the outputs of analog comparators 82a, 82b rise to a high logic level (pull-up resistors 91a, 91b ensure correct high and low levels), thereby causing the output of AND gate 66 to rise to a high logic level to develop active color control signal G.

The outputs B, G, and R may be respectively coupled to like inputs B, G, and R of the background buses in FIG. 4 for illuminating background area 32 in a color in accordance with the range in which the measured voltage lies. Alternatively, the outputs B, G, and R may be respectively coupled to like inputs B, G, and R of the display buses in FIG. 4 for illuminating display areas **31*a* to 31*f* of all display elements in display 41** in a color in accordance with the range in which the measured voltage lies.

Figure 11:
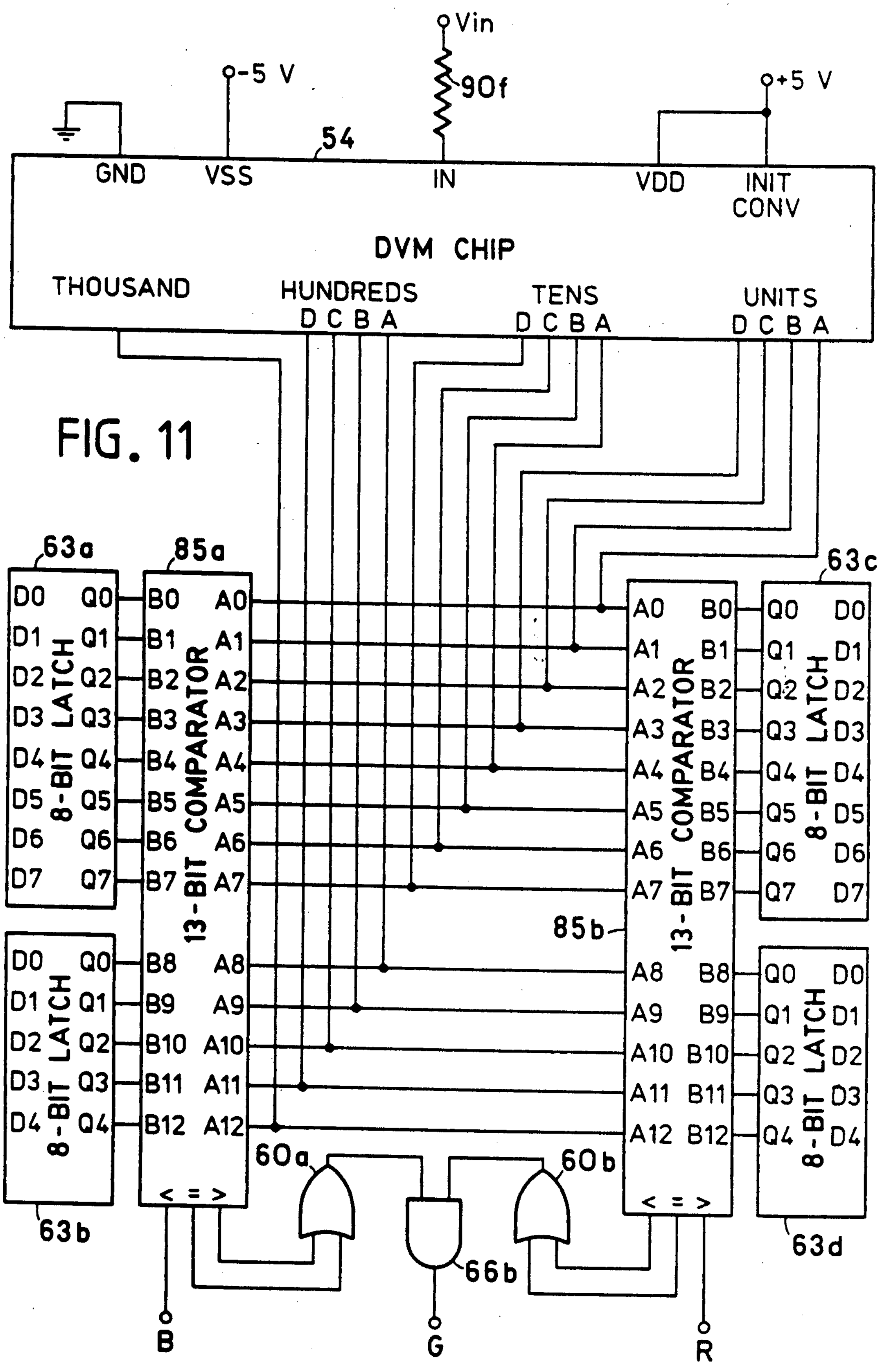
FIG. 11 is a schematic diagram of a digital comparator for developing color control signals.

In FIG. 11 is shown a schematic diagram of a digital voltmeter with a digital comparator for developing color control signals. A DVM chip 54 measures an input signal Vin applied via a resistor **90*f* to its input IN and develops at its outputs A, B, C, and D of Units, Tens, Hundreds, and Thousand digital data corresponding to the value of the measured input signal. The input INIT CONV (initiate conversion) is tied to a high logic level for causing DVM chip 54 to measure continuously. The output digital data are simultaneously applied to the inputs A0 to A12 of a 13-bit digital comparator 85*a* and to the inputs A0 to A12 of a like digital comparator 85*b*. Two 8-bit latches 63*a*, having its outputs Q0 to Q7 respectively coupled to the inputs B0 to B7 of digital comparator 85*a*, and 63*b*, having its outputs Q0 to Q4 respectively coupled to the inputs B8 to B12 of digital comparator 85*a*, are provided for storing a digital representation of a low limit. Two like latches 63*c*, having its outputs Q0 to Q7 respectively coupled to the inputs B0 to B7 of digital comparator 85*b*, and 63*d*, having its outputs Q0 to Q4 respectively coupled to the inputs B8 to B12 of digital comparator 85*b*, are provided for storing a digital representation of a high limit. The digital comparator 85*a* compares the output digital data with the low limit and develops comparison signals accordingly. The digital comparator 85*b* compares the output digital data with the high limit and develops comparison signals accordingly. It would be obvious that measurement limits may be readily changed by clocking new data, representing new low limit and new high limit, into latches 63*a* to 63*d*** (not shown).

When the output digital data of DVM chip 54 are less than the low limit, the output '<' of digital comparator **85*a* rises to a high logic level to generate an active color control signal B. When the output digital data are greater than the high limit, the output '>' of digital comparator 85*b* rises to a high logic level to generate an active color control signal R. When the output digital data are within the bounds of the low and high limits, one of the outputs '=' and '>' of digital comparator 85*a*, which are gated by an OR gate 60*a*, and one of the outputs '<' and '=' of digital comparator 85*b*, which are gated by an OR gate 60*b*, rise to a high logic level to force both inputs of an AND gate 66*b* to rise to a high logic level. As a consequence, the output of AND gate 66*b*** rises to a high logic level to generate active color control signal G.

The comparison outputs B, G, and R may be respectively coupled to like inputs of the background buses in FIG. 4 for causing background area 32 of display 41 to illuminate either in blue color when the measured value is less than the low limit, in red color when the measured value is greater than the high limit, or in green color when the measured value is within the bounds of the low and high limits. Alternatively, the comparison outputs B, G, and R may be respectively coupled to like inputs B, G, and R of the display buses in FIG. 4 for causing display areas **31*a* to 31*f* of the display elements in display 41** to illuminate in a color in accordance with the relation of the measured value to the low limit and the high limit. It would be obvious that the color sequences could be readily changed by differently interconnecting the comparison outputs with the color control inputs.

Figure 12:
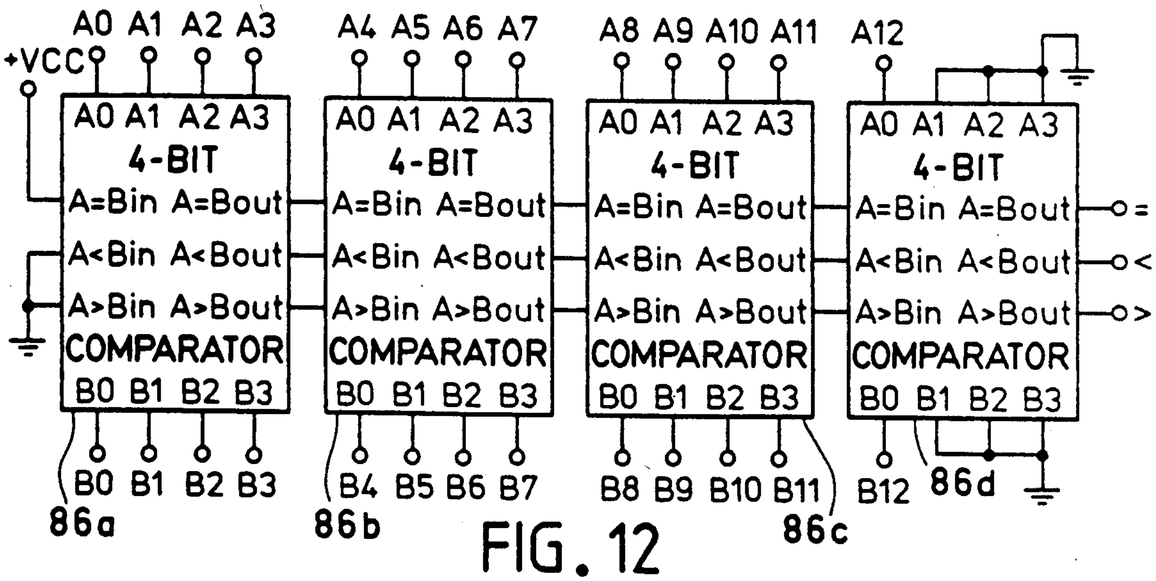
FIG. 12 is a detail of 13-bit digital comparator in FIG. 11.

FIG. 12 is a detail of one of 13-bit digital comparators **85*a*, 85*b* in FIG. 11. It will be appreciated that both digital comparators 85*a*, 85*b* may be substantially same. The comparison inputs '<', '=', and '>' of four 4-bit digital comparators 86*a*, 86*b*, 86*c*, and 86*d*** are respectively coupled to like preceding outputs, in a manner well understood by those skilled in the art, to extend the comparison range to 13 bits.

The invention may be now briefly summarized. A measuring device was disclosed that comprises signal measuring means and a display device for providing an indication of the measured value of the signal. The display device includes a plurality of adjacent display elements, each including a display area substantially surrounded by a variable color background area. The background areas have color control inputs which are respectively coupled for uniformly controlling their color. The color of the background areas thus effectively indicates that it relates to the indication of the measured value of the signal exhibited on the display areas.

It would be obvious that persons skilled in the art may resort to modifications in the construction of the preferred embodiments shown herein, without departing from the scope, as defined in the appended claims, and the spirit of the invention. It is contemplated that the principles of the invention may be also applied to numerous diverse types of display devices, such as liquid crystal devices, plasma devices, luminescent devices, cathode ray tube devices, and the like.

CORRELATION TABLE

This is a correlation table of reference characters, their descriptions and examples of commercially available parts.

| # | DESCRIPTION | EXAMPLE |
|---|---|---|
| 1 | display red LED | |
| 2 | display green LED | |
| 3 | display blue LED | |
| 4 | background red LED | |
| 5 | background green LED | |
| 6 | background blue LED | |
| 7 | opaque wall | |
| 8 | display light blending cavity | |
| 9 | background light blending cavity | |
| 10 | support | |
| 11 | variable color display | |
| 12 | display red bus | |
| 13 | display green bus | |
| 14 | display blue bus | |
| 16 | background red bus | |
| 17 | background green bus | |
| 18 | background blue bus | |
| 21 | segment color control | |
| 22 | background color control | |
| 23 | display decoder | |
| 25 | non-inverting buffer | 74LS244 |
| 31 | display segment | |
| 32 | background area | |
| 34 | light scattering material | |
| 35 | top surface of display area | |
| 36 | top surface of background area | |
| 41 | 3½ digit variable color display | |
| 51 | A/D converter | |
| 53 | Teledyne DVM chip | TSC7107 |
| 54 | Teledyne DVM chip | TSC8750 |
| 60 | 2-input OR gate | 74HC32 |
| 63 | 8-bit latch | 74HC373 |
| 65 | inverter | 74HC04 |
| 66 | 2-input AND gate | 74HC08 |
| 81 | analog comparator | |
| 82 | analog comparator chip | LM339 |

-continued

This is a correlation table of reference characters, their descriptions and examples of commercially available parts.

| # | DESCRIPTION | EXAMPLE |
|---|---|---|
| 84 | digital comparator | |
| 85 | 13-bit digital comparator | |
| 86 | 4-bit digital comparator | 74HC85 |
| 90 | resistor | |
| 91 | resistor | |
| 92 | potentiometer | |
| 93 | capacitor | |

What I claim is:

1. A measuring device comprising:
signal measuring means having an output indicative of a measured value of the signal;
display means including a plurality of adjacent display elements, each said display element including a display area and a variable color background area substantially surrounding said display area, each said background area having a color control input for controlling its color;
the color control inputs of said background areas being coupled;
means responsive to said output for causing an indication of the measured value of the signal to be exhibited on said display areas in a first color; and
means for activating the coupled color control inputs of said background areas to illuminate them in a uniform second color, whereby the color of said background areas effectively indicates that it relates to the indication of the measured value of the signal exhibited on said display areas.

2. A measuring device of claim 1 wherein the color control inputs of said background areas are interconnected.

3. A measuring device comprising:
signal measuring means having an output indicative of a measured value of the signal;
display means including a plurality of adjacent display elements, each said display element including a display area and a variable color background area substantially surrounding said display area, each said background area having a plurality of color control inputs for controlling its color;
the color control inputs of said background areas being respectively coupled;
means responsive to said output for causing an indication of the measured value of the signal to be exhibited on said display areas in a first color; and
means for selectively activating the coupled color control inputs of said background areas to illuminate them in a uniform second color, whereby the color of said background areas effectively indicates that it relates to the indication of the measured value of the signal exhibited on said display areas.

4. A measuring device of claim 3 wherein the color control inputs of said background areas are respectively interconnected.

5. A measuring device comprising:
signal measuring means having an output indicative of a measured value of the signal;
character display means including a plurality of adjacent display elements, each said display element including a character display area and a variable color background area substantially surrounding said display area, each said background area having a plurality of color control inputs for controlling its color;
the color control inputs of said background areas being respectively coupled;
means responsive to said output for causing a character indication of the measured value of the signal to be exhibited on said display areas in a first color; and
means for selectively activating the coupled color control inputs of said background areas to illuminate them in a uniform second color, whereby the color of said background areas effectively indicates that it relates to the character indication of the measured value of the signal exhibited on said display areas.

6. A measuring device comprising:
signal measuring means having an output indicative of a measured value of the signal;
display means including a plurality of adjacent display elements, each said display element including a display area and a variable color background area substantially surrounding said display area, each said background area having a red color control input, a green color control input, and a blue color control input for controlling its color;
the red color control inputs of said background areas being commonly coupled;
the green color control inputs of said background areas being commonly coupled;
the blue color control inputs of said background areas being commonly coupled;
means responsive to said output for causing an indication of the measured value of the signal to be exhibited on said display areas in a first color; and
means for selectively activating the coupled red color control inputs, the coupled green color control inputs, and the coupled blue color control inputs of said background areas to illuminate them in a selective uniform second color, whereby the color of said background areas effectively indicates that it relates to the indication of the measured value of the signal exhibited on said display areas.

7. A measuring device of claim 6 wherein:
the red color control inputs of said background areas are interconnected;
the green color control inputs of said background areas are interconnected; and
the blue color control inputs of said background areas are interconnected.

* * * * *